United States Patent
Wen et al.

(10) Patent No.: US 9,634,573 B2
(45) Date of Patent: Apr. 25, 2017

(54) POWER CONVERTER INCLUDING TWO CONVERTER CIRCUIT MODULES SHARING ONE DC CAPACITOR MODULE

(71) Applicant: Delta Electronics (Shanghai) Co., Ltd., Shanghai (CN)

(72) Inventors: Sen-Lin Wen, Shanghai (CN); Jian-Ping Ying, Shanghai (CN); Hong-Jian Gan, Shanghai (CN); Li-Feng Qiao, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 48 days.

(21) Appl. No.: 14/719,333

(22) Filed: May 22, 2015

(65) Prior Publication Data
US 2015/0340961 A1    Nov. 26, 2015

(30) Foreign Application Priority Data

May 23, 2014 (CN) .......................... 2014 1 0222820

(51) Int. Cl.
| | |
|---|---|
| H02M 5/458 | (2006.01) |
| H02M 7/00 | (2006.01) |
| H02M 7/487 | (2007.01) |
| H05K 7/14 | (2006.01) |
| H05K 7/20 | (2006.01) |

(52) U.S. Cl.
CPC .......... H02M 5/458 (2013.01); H02M 5/4585 (2013.01); H02M 7/003 (2013.01); H02M 7/487 (2013.01); H05K 7/1432 (2013.01); H05K 7/20909 (2013.01)

(58) Field of Classification Search
CPC ...... H02M 5/447; H02M 5/45; H02M 5/4505; H02M 5/458; H02M 7/10; H02M 7/48; H02M 7/51; H02M 7/103; H02M 7/106; H02M 1/22; H02M 1/30; H02M 1/32; H02M 3/3376; H02M 2001/0032
USPC ..... 363/34–37, 40, 44, 56.01, 56.02, 58–61, 363/65, 84, 107–109
See application file for complete search history.

(56) References Cited

U.S. PATENT DOCUMENTS

| | | | |
|---|---|---|---|
| 7,969,735 B2* | 6/2011 | Nakatsu ................ | H02M 7/003 165/104.33 |
| 9,019,731 B2* | 4/2015 | Tong ....................... | H02M 1/32 363/132 |

FOREIGN PATENT DOCUMENTS

| | | |
|---|---|---|
| CN | 101013818 A | 8/2007 |
| CN | 101197547 A | 6/2008 |
| CN | 202019146 U | 10/2011 |
| CN | 102097941 B | 12/2012 |

(Continued)

*Primary Examiner* — Yemane Mehari
(74) *Attorney, Agent, or Firm* — CKC & Partners Co., Ltd.

(57) ABSTRACT

The disclosure provides a power converter including a cabinet, a first converter circuit module, a second converter circuit module, and a DC capacitor module. The first converter circuit module includes at least one first bridge arm. The second converter circuit module includes at least one second bridge arm. The first converter circuit module, the second converter circuit module, and the DC capacitor module are disposed in the cabinet. The second bridge arm and the first bridge arm are arranged side by side in parallel. The DC capacitor module is electrically connected between the first bridge arm and the second bridge arm, so that the first bridge arm and the second bridge arm share the DC capacitor module.

11 Claims, 7 Drawing Sheets

(56) References Cited

FOREIGN PATENT DOCUMENTS

| | | |
|---|---|---|
| CN | 102891501 A | 1/2013 |
| CN | 102998564 A | 3/2013 |
| CN | 103066859 A | 4/2013 |
| CN | 103270682 A | 8/2013 |
| CN | 203166733 U | 8/2013 |
| CN | 203243232 U | 10/2013 |
| CN | 101782788 B | 11/2013 |
| JP | H1-64991 U | 4/1989 |

* cited by examiner

POWER CONVERTER INCLUDING TWO CONVERTER CIRCUIT MODULES SHARING ONE DC CAPACITOR MODULE

RELATED APPLICATIONS

This application claims priority to Chinese Application Serial Number 201410222820.5, filed May 23, 2014, which is herein incorporated by reference.

BACKGROUND

Technical Field

The present disclosure relates to a power converter.

Description of Related Art

Power converters, such as variable-frequency drives for driving electric machines, SVGs (Static Var Generator) in the power quality management field, and APFs (Active Power Filter), play an increasingly important role in the aspects of saving power and improving power quality. In many industrial fields, the power converters are more widely promoted and applied, and produce good economic and social benefits.

A MVD (Medium Voltage Drive) is a typical representative of power converters. A feature of a conventional power converter is that the power grid side connector terminal of the power converter requires a bulky and expensive phase-shifting transformer. Secondary side of the phase-shifting transformer is connected with diode rectifier circuits of many low-voltage single-phase power modules. The low-voltage single-phase power modules are connected in series to output a desired medium voltage. Each of the low-voltage single-phase power modules has a DC bus capacitor module. Therefore, the biggest drawback of the MVD is the requirement of the bulky and expensive phase-shifting transformer. In addition, power converter circuit part of the MVD requires a large number of DC bus capacitor modules, so the overall volume is huge and the costs are high.

In order to solve the foregoing problem, another kind of MVD based on power devices (e.g., IGBT/Diode) tandem technology has been proposed. One of advantages of the MVD is that the MVD no longer requires the bulky and expensive phase-shifting transformer. However, there exist different degrees of distribution among the DC bus capacitor modules of the MVD. For example, each phase of converter circuits is equipped with the corresponding DC bus capacitor module(s), and a bus bar is connected to a common connection point of the DC bus capacitor modules. The problem that arises is the product is equipped with a relatively large number of capacitors and the cost is increased, and the capacitors occupy a large space and thereby result in lower power density. In addition, there also exist risks of internal shocks among the distributed DC bus capacitor modules.

Accordingly, how to decrease volume of a power converter, increase power density, save manufacturing costs and transportation costs, and save space required for product installation become an important issue to be solved by those in the industry.

SUMMARY

The disclosure provides a power converter. The power converter includes a cabinet, a first converter circuit module, a second converter circuit module, and a DC capacitor module. The first converter circuit module is disposed in the cabinet and includes at least one first bridge arm. The second converter circuit module is disposed in the cabinet and includes at least one second bridge arm. The first bridge arm and the second bridge arm are arranged side by side in parallel. The DC capacitor module is disposed in the cabinet and electrically connected between the first bridge arm and the second bridge arm, so that the first bridge arm and the second bridge arm share the DC capacitor module.

In an embodiment of the disclosure, the cabinet has a first inlet and a second inlet respectively located at two opposite sides of the cabinet. The first bridge arm and the second bridge arm are located between the first inlet and the second inlet. The first bridge arm is adjacent to the first inlet, and the second bridge arm is adjacent to the second inlet.

In an embodiment of the disclosure, the cabinet further has an outlet. An air passage is formed between the first bridge arm and the second bridge arm. The outlet is located at an end of the air passage.

In an embodiment of the disclosure, the outlet is located at the top of the cabinet. The DC capacitor module is located at the bottom of the cabinet. The outlet and the DC capacitor module are respectively located at two ends of the air passage.

In an embodiment of the disclosure, the power converter further includes a blower fixed to the cabinet and communicated with the outlet.

In an embodiment of the disclosure, the DC capacitor module includes a capacitor array and a connection bus bar. The capacitor array is constituted by a plurality of arranged capacitor units. The capacitor units are electrically connected to the first bridge arm and the second bridge arm via the connection bus bar.

In an embodiment of the disclosure, the first converter circuit module is a three-phase converter circuit.

In an embodiment of the disclosure, the second converter circuit module is a three-phase converter circuit.

In an embodiment of the disclosure, the first bridge arm is a rectifier bridge arm or an inverter bridge arm.

In an embodiment of the disclosure, the second bridge arm is a rectifier bridge arm or an inverter bridge arm.

In an embodiment of the disclosure, the heat of the power converter can be dissipated by using a liquid cooling method or a heat pipe cooling method.

Accordingly, the power converter of the disclosure at least includes technical features of: (1) two converter circuit modules share one DC capacitor module; and (2) two converter circuit modules are located over the connection bus bar of the DC capacitor module and are arranged side by side in parallel. Therefore, the power converter of the disclosure at least includes the advantages of: (1) the power converter shares the centralized DC capacitor module, so as to reduce the number of used capacitors; (2) the overall configuration of the power converter is compact in volume, and the power density is high; and (3) the manufacturing costs, the transportation costs, and the space required for equipment installation can be saved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
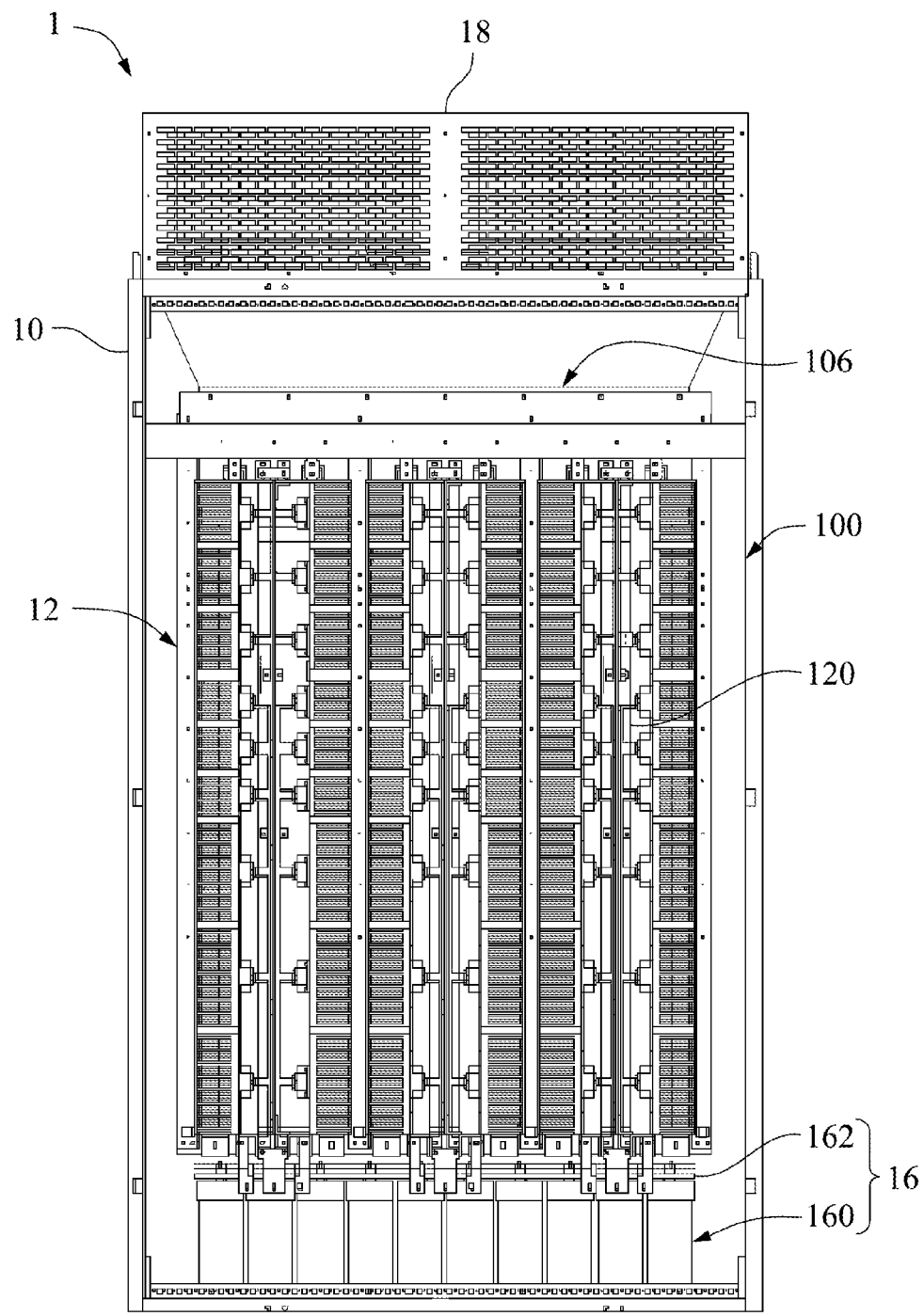
FIG. 1A is a front view of a power converter according to an embodiment of the disclosure.

Reference will be made in detail to the present embodiments of the disclosure, examples of which are illustrated in the accompanying drawings. Wherever possible, the same reference numbers are used in the drawings and the description to refer to the same or like parts.

Figure 1B:
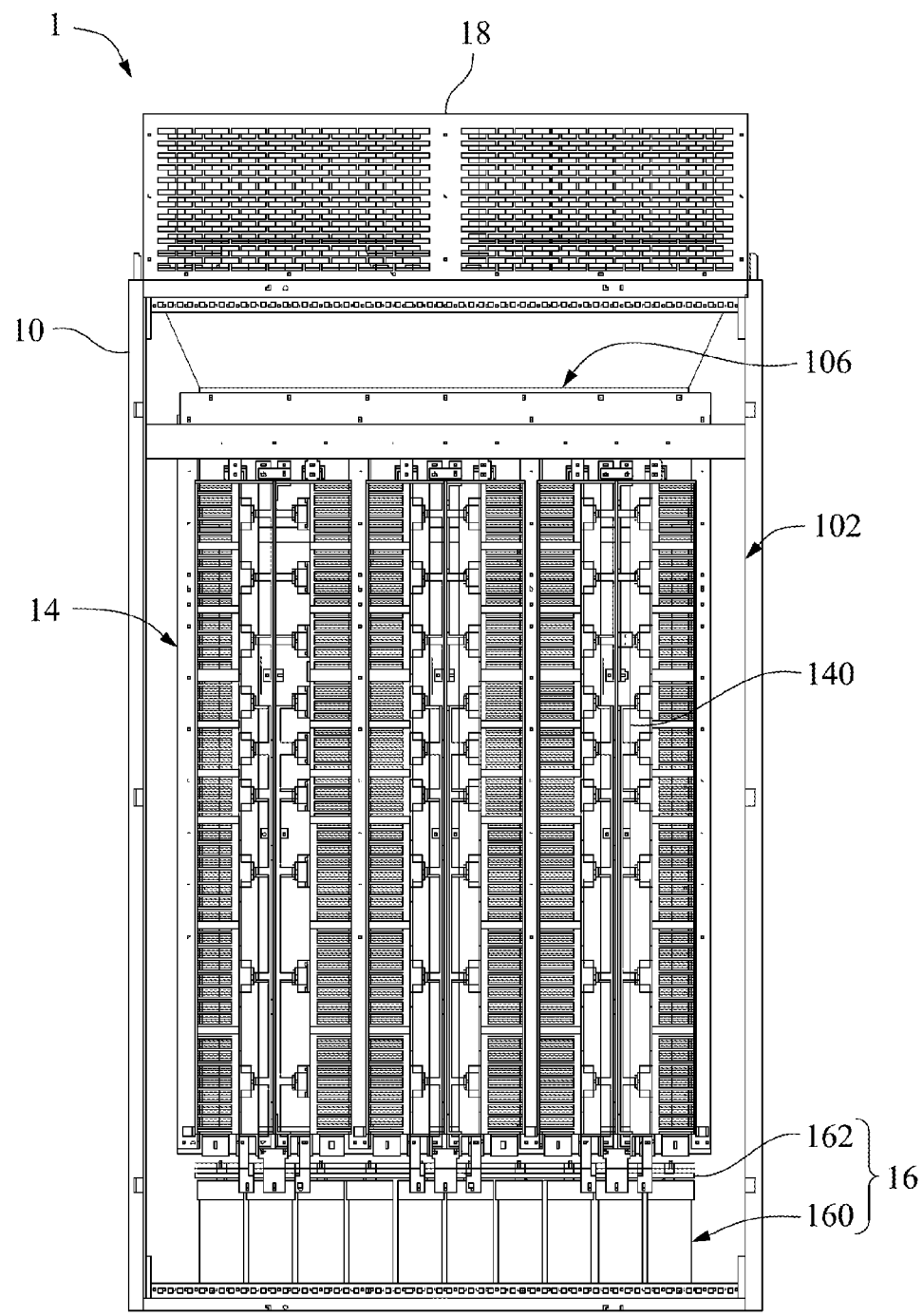
FIG. 1B is a rear view of the power converter in FIG. 1A.
Figure 2:
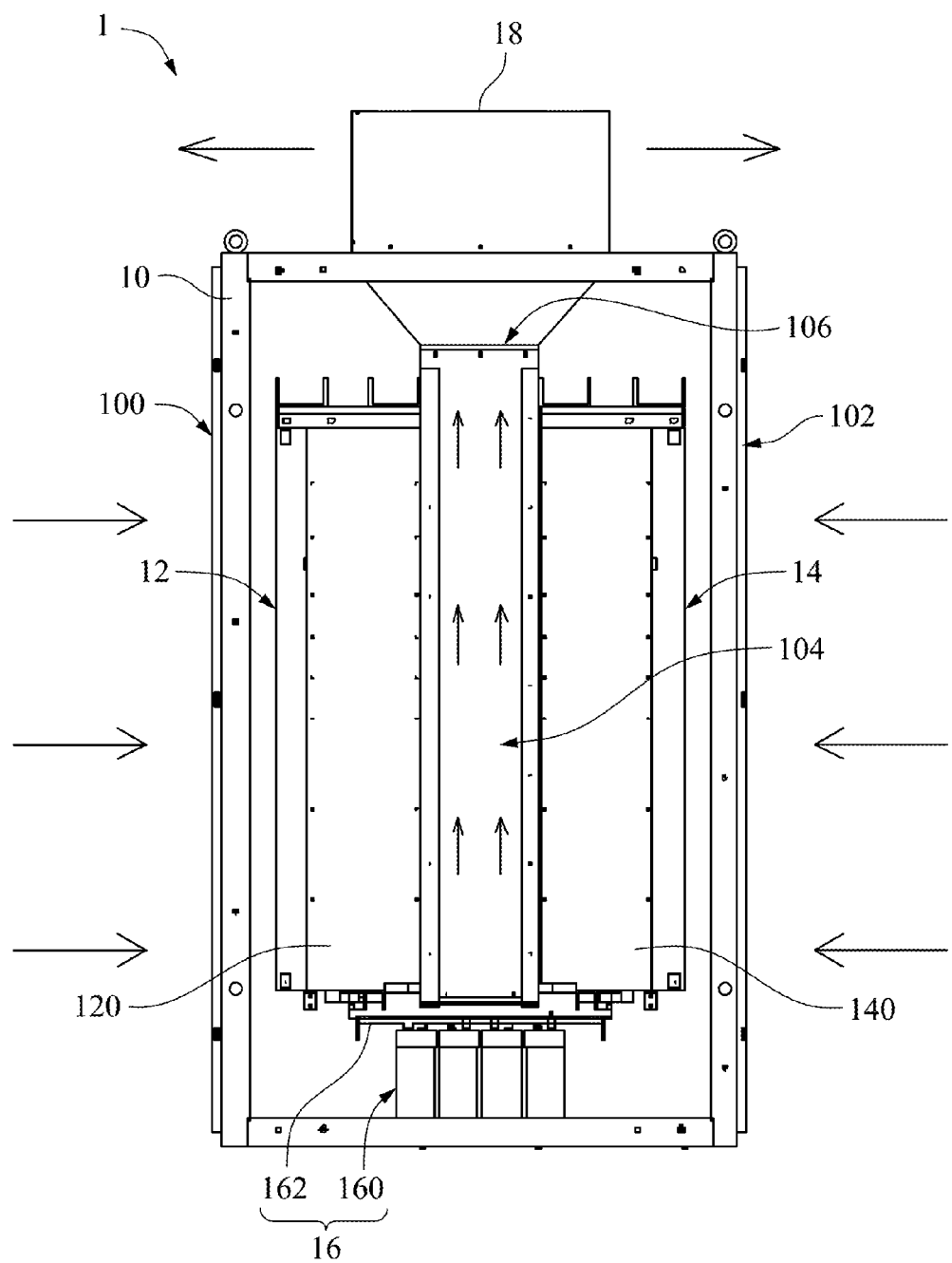
FIG. 2 is a side view of the power converter in FIG. 1A.

FIG. 1A is a front view of a power converter 1 according to an embodiment of the disclosure. FIG. 1B is a rear view of the power converter 1 in FIG. 1A. FIG. 2 is a side view of the power converter 1 in FIG. 1A.

As shown in FIG. 1A to FIG. 2, in the embodiment, the power converter 1 includes a cabinet 10, a first converter circuit module 12, a second converter circuit module 14, and a DC capacitor module 16. The first converter circuit module 12 of the power converter 1 is disposed in the cabinet 10 and includes at least one first bridge arm. In the embodiment, the first bridge arm is a rectifier bridge arm 120. The second converter circuit module 14 of the power converter 1 is disposed in the cabinet 10 and includes at least one second bridge arm. In the embodiment, the second bridge arm is an inverter bridge arm 140. The DC capacitor module 16 of the power converter 1 is disposed in the cabinet 10. The cabinet 10 of the power converter 1 has a first inlet 100 and a second inlet 102. The first inlet 100 and the second inlet 102 of the cabinet 10 are respectively located at two opposite sides (i.e., the front side shown in FIG. 1A and the rear side shown in FIG. 1B) of the cabinet 10. The rectifier bridge arm 120 of the first converter circuit module 12 and the inverter bridge arm 140 of the second converter circuit module 14 are located between the first inlet 100 and the second inlet 102 of the cabinet 10. The rectifier bridge arm 120 is adjacent to the first inlet 100 of the cabinet 10, and the inverter bridge arm 140 is adjacent to the second inlet 102 of the cabinet 10.

The cabinet 10 of the power converter 1 further has an outlet 106. An air passage 104 is formed between the rectifier bridge arm 120 of the first converter circuit module 12 and inverter bridge arm 140 of the second converter circuit module 14, and the outlet 106 of the cabinet 10 is located at an end of the air passage 104. In detail, the outlet 106 of the cabinet 10 is located at the top of the cabinet 10, and the DC capacitor module 16 is located at the bottom of the cabinet 10. The outlet 106 of the cabinet 10 and the DC capacitor module 16 are respectively located at two ends of the air passage 104.

Furthermore, the power converter 1 further includes a blower 18. The blower 18 of the power converter 1 is fixed to the cabinet 10 and communicates with the outlet 106. When the blower 18 of the power converter 1 operates, cold air outside the cabinet 10 will be introduced into the cabinet 10 from the first inlet 100 at the front side of the cabinet 10 and the second inlet 102 at the rear side of the cabinet 10. The cold air introduced from the first inlet 100 and the second inlet 102 will perform heat exchange with the rectifier bridge arm 120 of the first converter circuit module 12 and the inverter bridge arm 140 of the second converter circuit module 14. After passing through the rectifier bridge arm 120 and the inverter bridge arm 140, the cold air converges at the air passage 104 and then are exhausted out of the cabinet 10 by the blower 18 via the outlet 106 of the cabinet 10. By forming the first inlet 100 at the front side of the cabinet 10 and the second inlet 102 at the rear side of the cabinet 10, not only the cold air can perform large-area heat exchange with the rectifier bridge arm 120 and the inverter bridge arm 140, but also the conveniences of installation and maintenance of the power converter 1 can be increased.

It should be pointed out that one of the technical features of the present disclosure is that the DC capacitor module 16 of the power converter 1 is electrically connected between the rectifier bridge arm 120 of the first converter circuit module 12 and the inverter bridge arm 140 of the second converter circuit module 14. That is, the rectifier bridge arm 120 and the inverter bridge arm 140 share the DC capacitor module 16, so the power converter 1 of the present disclosure has the advantage of saving the number of used capacitors.

In addition, in the cabinet 10, the rectifier bridge arm 120 of the first converter circuit module 12 and the inverter bridge arm 140 of the second converter circuit module 14 are located over the DC capacitor module 16 and arranged side by side in parallel. More accurately, the rectifier bridge arm 120 and the inverter bridge arm 140 are parallel to the vertical direction in FIG. 2, and the rectifier bridge arm 120 and the inverter bridge arm 140 are arranged along the horizontal direction in FIG. 2. Therefore, the overall configuration of the power converter 1 of the present disclosure is compact in volume, and the power density is high.

In other embodiments, the heat of the power converter 1 can be dissipated by using a liquid cooling method or a heat pipe cooling method.

Figure 3:
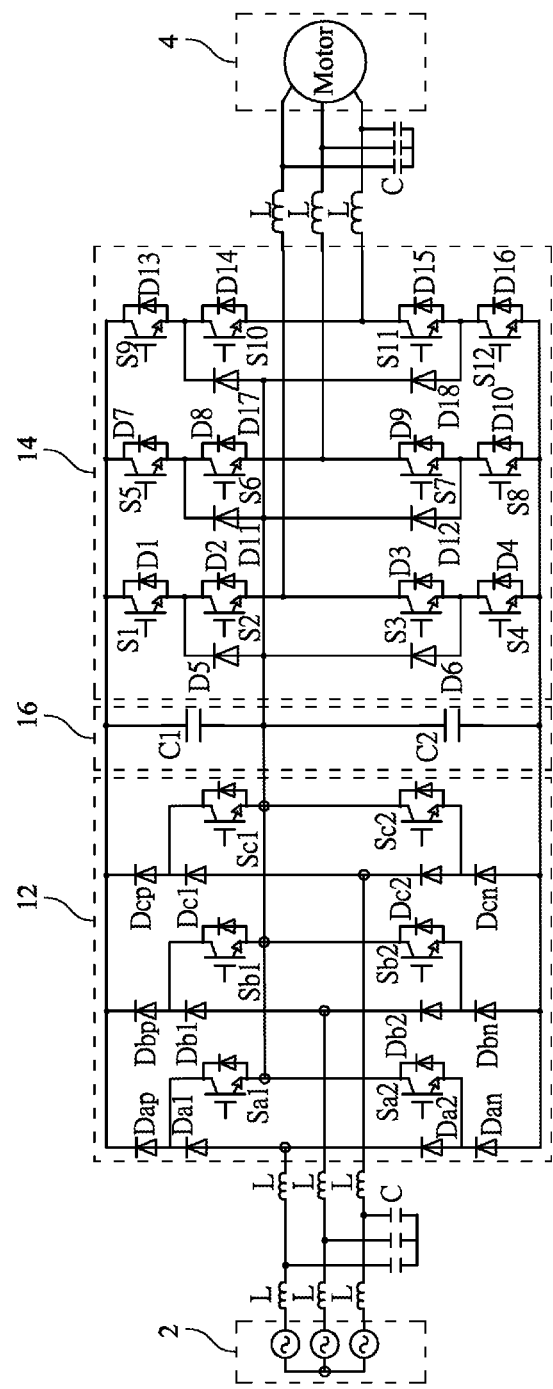
FIG. 3 is a system schematic diagram of the power converter according to an embodiment of the disclosure.

FIG. 3 is a system schematic diagram of the power converter 1 according to an embodiment of the disclosure.

As shown in FIG. 3, in the embodiment, the first converter circuit module 12 of the power converter 1 is embodied by a Vienna rectifier circuit, the second converter circuit module 14 is embodied by a NPC three-level inverter circuit, and the first converter circuit module 12 and the second converter circuit module 14 share the DC capacitor module 16. It can be seen that the first converter circuit module 12 includes three rectifier bridge arms 120, and the second converter circuit module 14 includes three inverter bridge arms 140. AC terminals at the upper end of the first converter circuit module 12 are connected to three-phase AC input cables of power grid 2. AC output terminals at the upper end of the second converter circuit module 14 are connected to three-phase AC cables of motor 4. The rectifier bridge arms 120 of the first converter circuit module 12 and the inverter bridge arms 140 of the second converter circuit module 14 are made from power devices, driving and controlling circuits, protection circuits, radiators, and etc. Each phase converter circuit in the first converter circuit module 12 and the second converter circuit module 14 is designed to have an upper-half bridge arm module and a lower-half bridge arm module, and the upper-half bridge arm module and the lower-half bridge arm module are arranged face to face to form a bridge arm.

Figure 4:
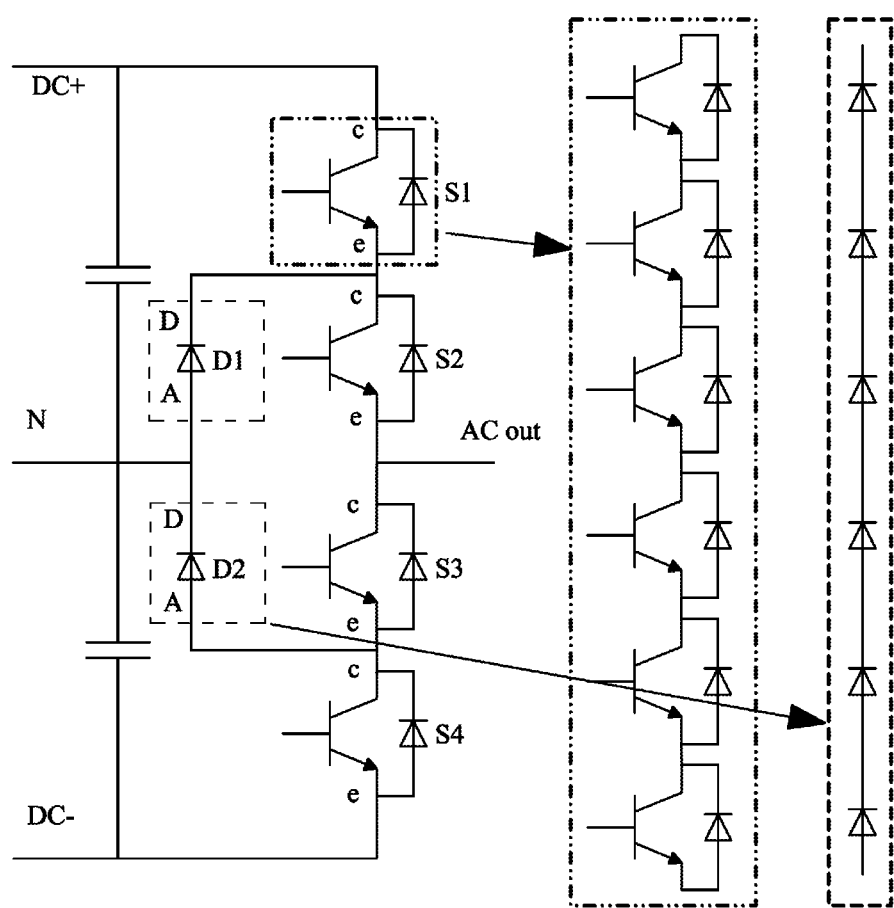
FIG. 4 is a circuit schematic diagram of a second converter circuit module according to an embodiment of the disclosure.

FIG. 4 is a circuit schematic diagram of the second converter circuit module 14 according to an embodiment of the disclosure.

As shown in FIG. 4, the second converter circuit module 14 is a NPC three-level inverter circuit based on power devices (e.g., IGBT/Diode) tandem technology, in which each of the power devices are made by connecting several low-voltage devices (e.g., there are six low-voltage devices shown in FIG. 4) in series. The upper-half bridge arm module is made from devices S1, S2, and D1, and the lower-half bridge arm module is made from devices S3, S4, and D2. The upper-half bridge arm module and the lower-half bridge arm module are parallel to each other and arranged face to face. The Vienna rectifier circuit in FIG. 3 is similar to the NPC three-level inverter circuit. Each of power devices in the Vienna rectifier circuit is made by connecting several low-voltage devices in series, the power devices constitute upper-half bridge arm module and lower-half bridge arm module similar to those in the NPC three-level inverter circuit, and the upper-half bridge arm module and lower-half bridge arm module are similarly arranged face to face.

Figure 5:
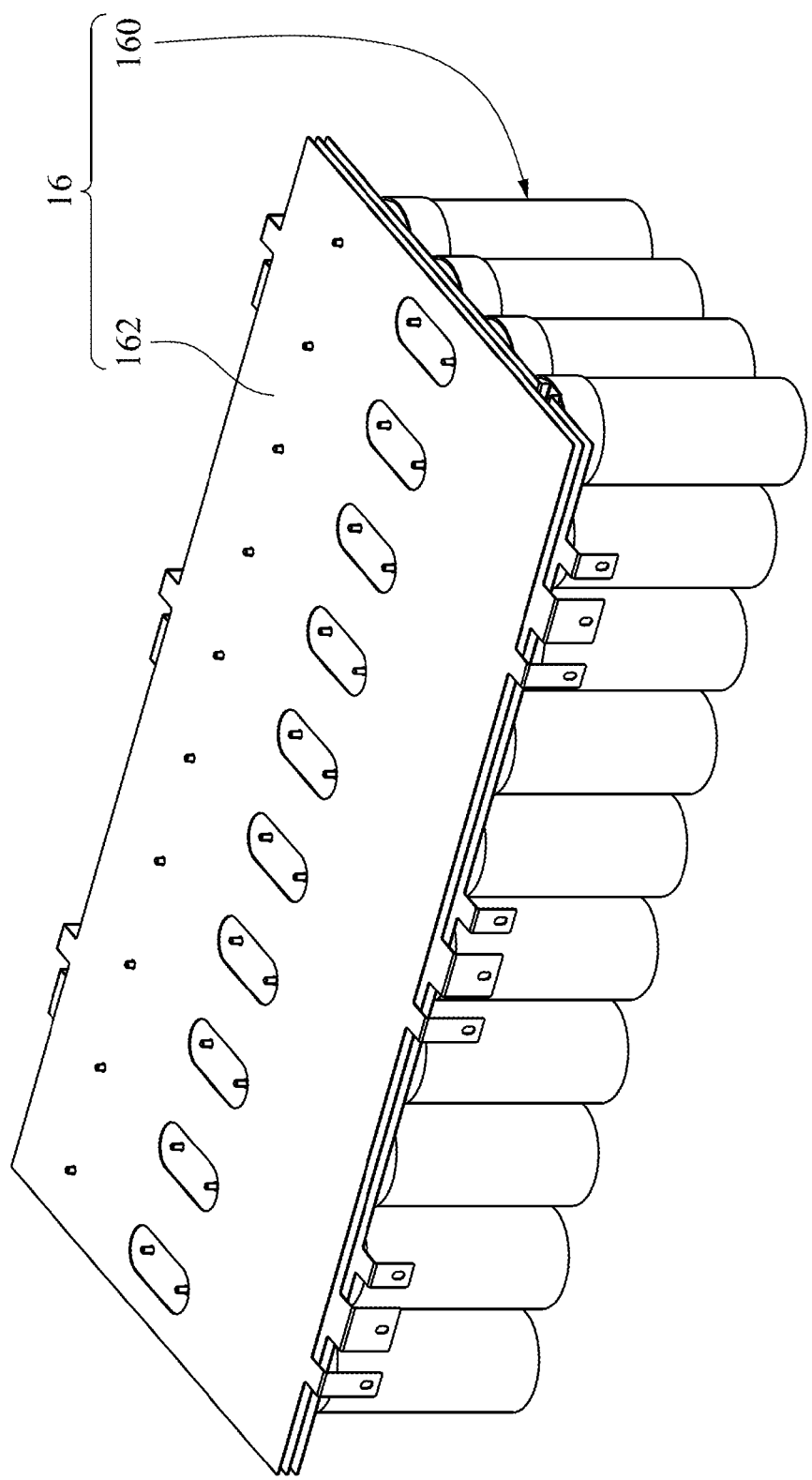
FIG. 5 is perspective view of a DC capacitor module in FIG. 1A.

FIG. 5 is perspective view of the DC capacitor module 16 in FIG. 1A.

As shown in FIG. 3 and FIG. 5, in the embodiment, the DC capacitor module 16 includes a capacitor array 160 and a connection bus bar 162. The capacitor array 160 is constituted by a plurality of arranged capacitor units. The capacitor units of the capacitor array 160 are electrically connected to the rectifier bridge arm 120 of the first converter circuit module 12 and the inverter bridge arm 140 of the second converter circuit module 14 via the connection bus bar 162. In detail, three sets of DC terminals (e.g., DC+/DC− or DC+/NP/DC−) are designed at each side of the connection bus bar 162 of the DC capacitor module 16. The three rectifier bridge arms 120 of the first converter circuit module 12 are arranged in a line to constitute a three-phase convert circuit, the three inverter bridge arms 140 of the second converter circuit module 14 are also arranged in a line to constitute another three-phase convert circuit. The DC terminals of the three-phase convert circuits (i.e., the first converter circuit module 12 and the second converter circuit module 14) are electrically connected to the DC terminals of the DC capacitor module 16. The three-phase convert circuits are located over the connection bus bar 162 of the DC capacitor module 16 and arranged side by side in parallel. Under the foregoing configuration, all of the converter circuits of the power converter 1 share the single DC capacitor module 16, so the overall configuration of the power converter 1 is compact in volume and guarantees a high power density, and the manufacturing costs, the transportation costs, and the space required for equipment installation can be saved.

Figure 6:
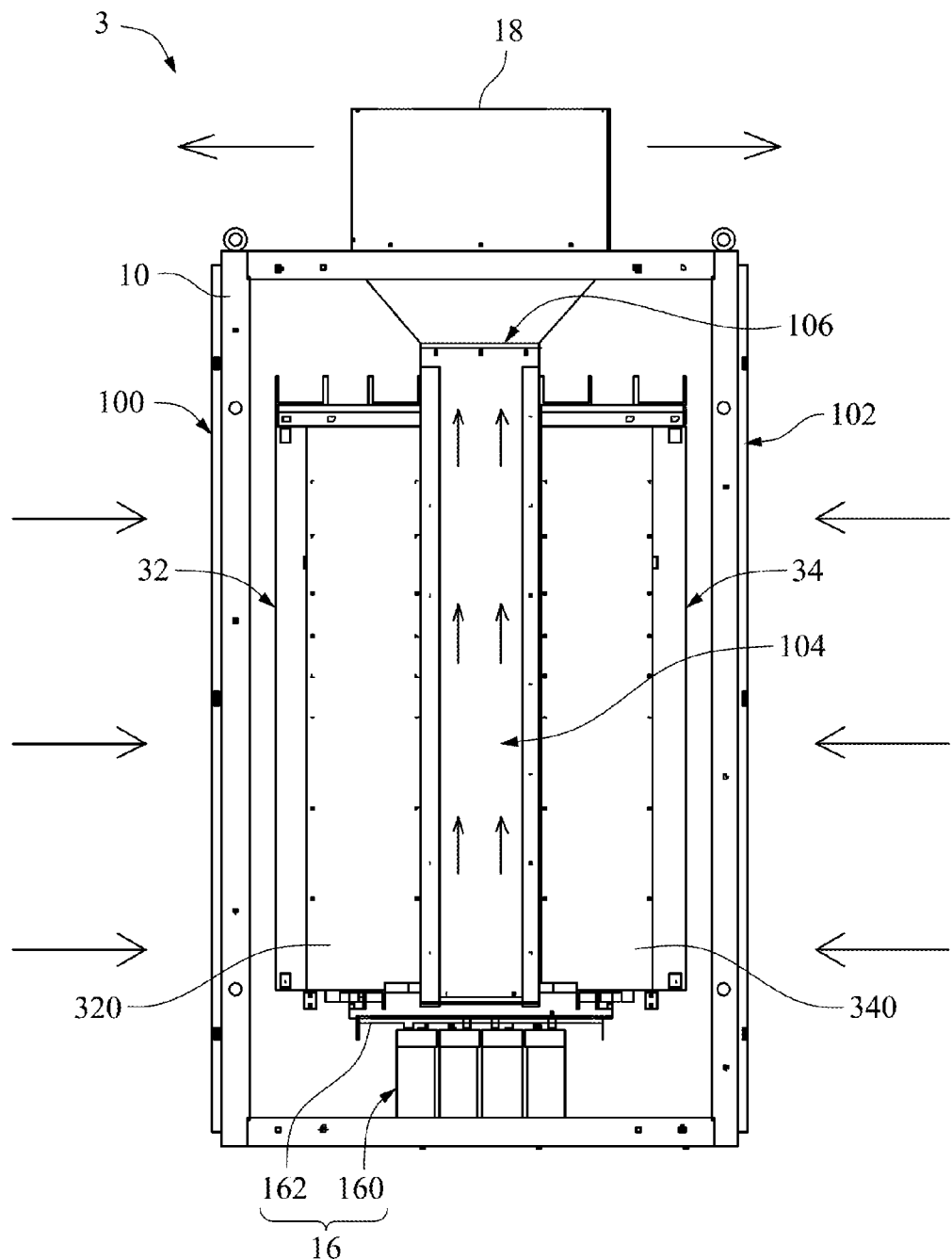
FIG. 6 is a side view of a power converter according to another embodiment of the disclosure.

FIG. 6 is a side view of a power converter 3 according to another embodiment of the disclosure.

As shown in FIG. 6, in the embodiment, the power converter 3 includes the cabinet 10, a first converter circuit module 32, a second converter circuit module 34, the DC capacitor module 16, and the blower 18. The structures, functions, and connection relationships of the cabinet 10, the DC capacitor module 16, and the blower 18 in the embodiment are similar to those in the embodiment shown in FIG. 2, so they are not introduced again here.

It should be pointed out that the first converter circuit module 32 and the second converter circuit module 34 in the present embodiment are different from the first converter circuit module 12 and the second converter circuit module 14 in the embodiment shown by in FIG. 2. In the present embodiment, the first bridge arm included in the first converter circuit module 32 is a first inverter bridge arm 320, and the second bridge arm included in the second converter circuit module 34 is a second inverter bridge arm 340. In other words, the power converter 3 of the present embodiment can be obtained by replacing the rectifier bridge arms 120 by the inverter bridge arms 140 shown in FIG. 2. It can be seen that in the power converter 3 of the present embodiment, there are two converter circuit modules having the same topological structure are located over the centralized and shared DC capacitor module 16. By connecting AC terminals at the upper ends of the converter circuit modules to three-phase AC cables of the power grid 2, two sets of medium voltage and high-power NPC three-level SVGs (Static Var Generator) that share the DC capacitor module 16 and are connected in parallel can be obtained, and the capacities of the SVGs can be increased with a guaranteed high power density.

An APF (Active Power Filter) and a SVG have the same topological structure, so the present embodiment can be applied to a parallel type NPC three-level medium voltage and high-power APF.

In other embodiments, the inverter bridge arms 140 can also be replaced by the rectifier bridge arms 120, so as to obtain a power converter which has two sets of rectifier bridge arms 120.

According to the foregoing recitations of the embodiments of the disclosure, it can be seen that the power converter of the disclosure at least includes technical features of: (1) two converter circuit modules share one DC capacitor module; (2) three sets of DC terminals are designed at each side of the connection bus bar of the DC capacitor module; (3) three modular convert circuits (bridge arms) are arranged in a line to constitute a set of three-phase converter circuit module, and the DC terminals of the three-phase converter circuit module are electrically connected to the corresponding DC terminals of the DC capacitor module; and (4) two sets of converter circuit modules are located over the connection bus bar of the DC capacitor module and arranged side by side in parallel. Therefore, the power converter of the disclosure at least includes advantages of: (1) the power converter shares the centralized DC capacitor module, so as to reduce the number of used capacitors; (2) the overall configuration of the power converter is compact in volume, and the power density is high; and (3) the manufacturing costs, the transportation costs, and the space required for equipment installation can be saved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power converter, comprising:
a cabinet;
a first converter circuit module disposed in the cabinet and comprising at least one first bridge arm;
a second converter circuit module disposed in the cabinet and comprising at least one second bridge arm, wherein the first bridge arm and the second bridge arm are parallel to a first direction and arranged side by side along a second direction, and an air passage is formed between the first bridge arm and the second bridge arm; and a DC capacitor module disposed in the cabinet and electrically connected between the first bridge arm and the second bridge arm, so that the first bridge arm and the second bridge arm share the DC capacitor module.

2. The power converter of claim 1, wherein the cabinet has a first inlet and a second inlet respectively located at two opposite sides of the cabinet, the first bridge arm and the second bridge arm are located between the first inlet and the second inlet, the first bridge arm is adjacent to the first inlet, and the second bridge arm is adjacent to the second inlet.

3. The power converter of claim 2, wherein the cabinet further has an outlet, and the outlet is located at an end of the air passage.

4. The power converter of claim 2, wherein the outlet is located at the top of the cabinet, the DC capacitor module is located at the bottom of the cabinet, and the outlet and the DC capacitor module are respectively located at two ends of the air passage.

5. The power converter of claim 2, further comprising a blower fixed to the cabinet and communicated with the outlet.

6. The power converter of claim 1, wherein the DC capacitor module comprises:
   a capacitor array constituted by a plurality of arranged capacitor units; and
   a connection bus bar, wherein the capacitor units are electrically connected to the first bridge arm and the second bridge arm via the connection bus bar.

7. The power converter of claim 1, wherein the first converter circuit module is a three-phase converter circuit.

8. The power converter of claim 1, wherein the second converter circuit module is a three-phase converter circuit.

9. The power converter of claim 1, wherein the first bridge arm is a rectifier bridge arm or an inverter bridge arm.

10. The power converter of claim 1, wherein the second bridge arm is a rectifier bridge arm or an inverter bridge arm.

11. The power converter of claim 1, wherein the heat of the power converter can be dissipated by using a liquid cooling method or a heat pipe cooling method.

* * * * *